United States Patent
Hong et al.

(10) Patent No.: US 9,804,465 B2
(45) Date of Patent: Oct. 31, 2017

(54) METHOD FOR DETECTING DEFECTS OF TFT ARRAY SUBSTRATE

(71) Applicant: Shenzhen China Star Optoelectronics Technology Co., Ltd., Shenzhen, Guangdong (CN)

(72) Inventors: Ri Hong, Guangdong (CN); Kecheng Xie, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 36 days.

(21) Appl. No.: 14/785,954

(22) PCT Filed: Jun. 26, 2015

(86) PCT No.: PCT/CN2015/082529
§ 371 (c)(1),
(2) Date: Dec. 30, 2015

(87) PCT Pub. No.: WO2016/187922
PCT Pub. Date: Dec. 1, 2016

(65) Prior Publication Data
US 2017/0139248 A1    May 18, 2017

(30) Foreign Application Priority Data

May 26, 2015 (CN) .......................... 2015 1 0273831

(51) Int. Cl.
*H01L 21/00* (2006.01)
*G02F 1/1368* (2006.01)
*G02F 1/1362* (2006.01)

(52) U.S. Cl.
CPC ...... *G02F 1/1368* (2013.01); *G02F 1/136259* (2013.01); *G02F 2001/136254* (2013.01); *G02F 2001/136268* (2013.01)

(58) Field of Classification Search
None
See application file for complete search history.

(56) References Cited

U.S. PATENT DOCUMENTS

2008/0099429 A1* 5/2008 Cheng ................... G02B 5/201
                                                          216/21
2015/0008438 A1* 1/2015 Im ...................... H01L 27/1222
                                                          257/72

* cited by examiner

*Primary Examiner* — Angel Roman
(74) *Attorney, Agent, or Firm* — Kim Winston LLP

(57) ABSTRACT

Disclosed is a method for detecting defects of a TFT array substrate. The method comprises steps of: positioning an abnormal area of the TFT array substrate; separating the abnormal area from other areas of the array substrate; and treating the abnormal area as such that multiple layers in the abnormal area can be revealed one by one, and detecting the revealed layers to determine a defective layer in the abnormal area.

14 Claims, 5 Drawing Sheets

METHOD FOR DETECTING DEFECTS OF TFT ARRAY SUBSTRATE

CROSS-REFERENCE TO RELATED APPLICATIONS

The present application claims benefit of Chinese patent application CN201510273831.0, entitled "Method for detecting defects of TFT array substrate" and filed on May 26, 2015, the entirety of which is incorporated herein by reference.

TECHNICAL FIELD

The present disclosure relates to the technical field of testing liquid crystal display devices, and in particular, to a method for detecting defects of a TFT array substrate.

TECHNICAL BACKGROUND

TFT liquid crystal display devices are now becoming increasingly popular for its lightness, environmental friendliness, and high performance. Required by the wider application domains, liquid crystal display devices are becoming larger and larger in size. At present, the screen of a 65-inch single screen liquid crystal display device can have a resolution of 1920*1080. At such a high integration level, defects of the products will also increase. Therefore, it is of great importance to reinforce quality detection of liquid crystal display devices in mass production, detect the defects of sampled array substrates and analyze causes of the defects.

In existing technologies, there is not yet an effective method for detecting the above defects. So far, the detection is mainly performed by a detector who judges an abnormal area possibly having defects based on his/her experience, and cuts the abnormal area for analysis. This method can only roughly position a potentially defective thin film transistor, but cannot accurately find the specific layer where the abnormity exists. Besides, after the abnormal point is found by cutting the abnormal area, it is very difficult to further analyze the area, the scope, as well as the surrounding structures of the abnormal point (e.g., points causing an open circuit or short circuit). Moreover, in the method, the layer can easily get damaged by the cutting, which can influence the result of the analysis.

Currently, the integration level of TFT array substrates is getting higher and higher, and TFT array substrates are provided with more and more layers which are superimposed one by one. Consequently, after all processes, a defective layer may be covered by other layers. Additionally, in color filter on array (COA) technology, a color resistance layer is also integrated onto the array substrate, which enables it even harder to detect the abnormal layer.

Therefore, in order to solve the above problem, a method for effectively positioning defects of a TFT array substrate is highly desirable.

SUMMARY OF THE INVENTION

One of the technical problems to be solved by the present disclosure is how to provide a method for effectively positioning defects of a TFT array substrate.

In order to solve the above technical problem, the embodiments of the present disclosure provide a method for detecting defects of a TFT array substrate. The method comprises steps of: positioning an abnormal area of the TFT array substrate; separating the abnormal area from other areas of the array substrate; and treating the abnormal area as such that multiple layers in the abnormal area can be revealed one by one, and detecting the revealed layers to determine a defective layer in the abnormal area.

Preferably, the layers are removed one by one through etching so that the multiple layers in the abnormal area can be revealed one by one.

Preferably, an etching agent and a corresponding etching time are selected as such that that only a layer to be etched is etched in each etching, and that a layer to be detected will not be damaged.

Preferably, the detection is stopped when the defective layer is detected, or after each of the layers in the abnormal area is detected.

Preferably, the abnormal area is separated from other areas of the array substrate by a specially shaped separating board.

Preferably, the step of separating the abnormal area from other areas of the array substrate further comprises steps of: covering the abnormal area with the specially shaped separating board; and removing the separating board when other areas are covered with a coating which forms a protecting layer.

Preferably, the protecting layer contains Tuffy adhesive.

Preferably, if the abnormal area is located at a thin film transistor, the method comprises the following steps. In step 1, the abnormal area is covered by the separating board at the top thereof. In step 2, after other areas are coated with Tuffy adhesive which forms the protecting layer, the separating board is removed. In step 3, a first passivation layer is etched away using phosphoric acid or HF so as to reveal a source-drain metal layer, and the source-drain metal layer is detected using a detecting device. The detection is stopped if a defect is detected, and step 4 is performed if no defect is detected. In step 4, the source-drain metal layer is etched to reveal an ohmic contact layer, and the ohmic contact layer is detected using a detecting device. The detection is stopped if a defect is detected, and step 5 is performed if no defect is detected. In step 5, the ohmic contact layer is etched to reveal a semi-conductor layer, and the semi-conductor layer is detected using a detecting device. The detection is stopped if a defect is detected, and step 6 is performed if no defect is detected. In step 6, the semi-conductor layer and a gate protecting layer are etched one by one so as to reveal a gate metal layer, and the gate metal layer is detected using a detecting device.

Preferably, if the thin film transistor in the abnormal area is provided further with a color resistance layer and a second passivation layer at the top thereof, the method further comprises the following steps prior to step 3. The second passivation layer is etched using phosphoric acid or HF to reveal the color resistance layer. The color resistance layer is detected using a detecting device. The color resistance layer is etched using an alkali to reveal the first passivation layer located at an outmost part of the thin film transistor.

Preferably, the separating board is a round or elliptical iron sheet, and the area of the separating board is determined by the range of the abnormal area.

Compared with existing technologies, one or more of embodiments of the above technical solutions can achieve the following beneficial effects.

By analyzing the multiple layers of the TFT array substrate one by one, the method reduces the interactive effects among the multiple layers, and improves the capability of detecting defects of the array substrate, and further, reduces the time for the analysis and improves the analysis capability. The method can be used in development of new products, and can reduce the time for developing products, thereby improving the competitiveness of products.

Other features and advantages of the present disclosure will be further explained in the following description, and will partly become self-evident therefrom, or be understood through the implementation of the present disclosure. The objectives and advantages of the present disclosure will be achieved through the structures specifically pointed out in the description, claims, and the accompanying drawings.

BRIEF DESCRIPTION OF THE DRAWINGS

The accompanying drawings are provided for a further understanding of the present disclosure or the existing technologies, and constitute a part of the description. The drawings for the embodiments of the present disclosure, together with the embodiments of the present disclosure, are provided for illustrating the technical solutions of the present disclosure, rather than limiting the present disclosure.

DETAILED DESCRIPTION OF THE EMBODIMENTS

The present disclosure will be explained in detail below with reference to the embodiments and the accompanying drawings, so that one can fully understand how the present disclosure solves the technical problem and achieves the technical effects through the technical means, thereby implementing the same. It should be noted that as long as there is no structural conflict, any of the embodiments and any of the technical features thereof may be combined with one another, and the technical solutions obtained therefrom all fall within the scope of the present disclosure.

TFT array substrate has multiple layers formed by multiple-step film-forming process. The process for forming multiple layers comprises steps of washing, CVD film forming, sputter film forming, exposing, developing and stripping, wet etching, dry etching, etc. Abnormity in layers, such as short circuit or open circuit in a TFT array substrate, may possibly appear in each of the above steps. Therefore, in mass production of substrates, it is necessary to perform sampling detection for substrates repeatedly. Further, sampling an abnormal array substrate to position and analyze a defect thereof, accurately position a specific layer where the abnormity exists, and find the causes of the defect, will contribute to the repair of other array substrates having the same defects in the mass production, which is helpful to enhance productivity. The embodiments of the present disclosure provide a method for positioning a defective layer by detecting multiple layers of a TFT array substrate.

Figure 1:
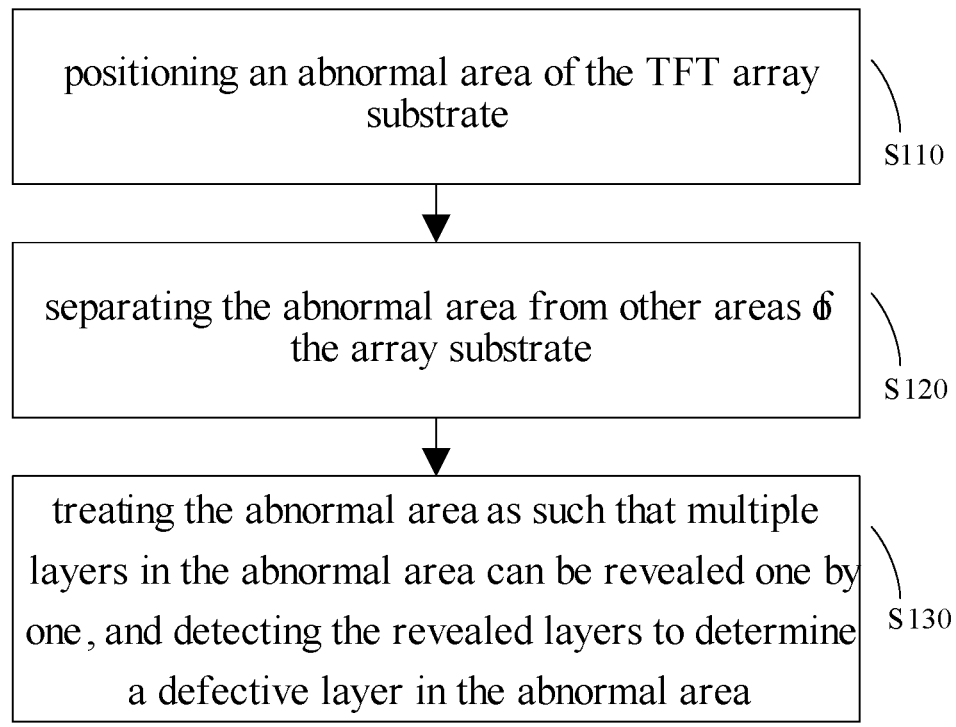
FIG. 1 schematically shows a flow chart of a method for detecting defects of a TFT array substrate according to embodiments of the present disclosure.

FIG. 1 schematically shows a flow chart of a method for detecting defects of a TFT array substrate according to embodiments of the present disclosure. The method comprises the following steps.

In step S110, an abnormal area of the TFT array substrate is positioned. In step S120, the abnormal area is separated from other areas of the array substrate. In step S130, the abnormal area is treated as such that multiple layers in the abnormal area are revealed one by one, and the revealed layers are detected to determine a defective layer in the abnormal area.

First, a range on the TFT array substrate where an internal defect may exist is determined. An internal defect in an array substrate may leads to an obvious external defect, such as abnormal color of image displayed by the liquid crystal display device, or black spots on the screen. By observing the external defect, the general range of the possible internal defect can be determined. Then, by means of a commonly used detecting device for substrates, the range can be narrowed down, and thus the area where the internal defect exists, namely an abnormal area, can be determined. Commonly used detecting devices include open circuit or short circuit detecting devices, optical automated visual inspection devices, array substrate detecting devices, etc.

Then, the abnormal area is separated from other areas of the array substrate. In the embodiments of the present disclosure, the abnormal area is separated from other areas of the array substrate by a specially shaped separating board. Specifically, the shape and area of the separating board are dependent on the range of the abnormal area. A large-sized separating board may introduce effects of a neighboring pixel unit, and a small-sized separating board may harm subsequent detection operations. Usually, the area of the separating board can be 10%-30% larger than the range of the abnormal area. It should be ensured that the separating board is formed of materials that will not react with layers to be analyzed or lead to ion release, thus preventing damages to layers under the separating board. For example, materials of the separating board can be chrome, iron, copper, or polyvinyl acetate.

Then, surrounding areas of the separating board are coated with a material which forms a protecting layer. It should be ensured that the protecting layer will not be damaged by any of physical or chemical treatments in the subsequent steps. For example, the protecting layer can be formed of Tuffy adhesive. Further, the protecting layer is not restricted in its thickness, and the value of the thickness can range from 0.1 mm to 10 mm. It should be noted that, when coating the material of the protecting layer, one should try to ensure that the material of the protecting layer is not in contact with the separating board, so that the separating board can be removed directly after the protecting layer is formed. If the material of the protecting layer is coated on the separating board, the separating board has to be removed by etching, which will consume time and increase the cost.

After the separating board is removed, the areas which are previously covered by the separating board are revealed, and the separation of the abnormal area from other areas is achieved along a direction perpendicular to the surface of the screen of the liquid crystal display device. In this manner, when each of the layers is removed by means of a physical method or a chemical method, the areas covered by the protecting layer will not be damaged.

The step of analyzing the multiple layers in the abnormal area specifically comprises steps of: treating the abnormal area as such that the multiple layers in the abnormal area can be revealed one by one; and detecting the revealed layers. A defective layer in the abnormal area can be determined by analyzing the layers. Specifically, the methods for revealing the multiple layers in the abnormal area can be chemical or physical methods, and the present disclosure is not restricted in this regard. The specific process can be determined with reference to current film forming process, and it corresponds substantially to a reverse process of the film forming process. The time and pressure required by removal of each of the layers can be determined by the devices used and the thickness of the layers. Further, an etching agent and a corresponding etching time are selected as such that only a layer to be etched is etched in each etching, and that a layer to be detected will not be damaged. A remover liquid for removing each of the layers can be determined by the layer to be removed. For example, an organic layer can be removed through wet etching using a strong acid such as HCL, and an inorganic layer can be removed through wet etching using a neutral acid such as HF and $H_3PO_4$, or an organic base such as tetrahydrofuran. In addition, when removing the layers, one should adopt a high selection ratio of the layer, so that the lower layers will not be damaged when the upper layers are removed. This is because integrity of a layer is the basis of precise measurement.

Before a layer is removed, the layer has to be tested. The test of a layer includes detecting the external quality, surface form, thickness, rigidity, adherence, chemical stability, thermostability and etching resistance of the layer using various testing devices. Based on results of the tests, it can be determined whether there is a defect in the layer, and the causes of the defect can be analyzed. For example, foreign matters in a layer can be analyzed (analysis of external quality) using a Fourier transform infrared spectroscopy (FTIR) spectrometer, and characters of a layer can be analyzed (analysis of the thickness, rigidity, and chemical stability of the layer) using an ultraviolet spectrograph.

Figure 2:
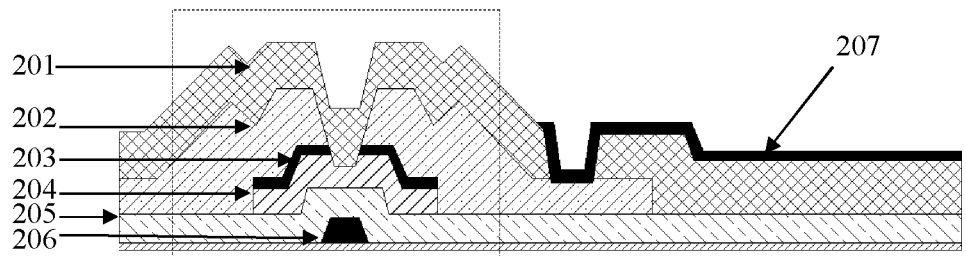
FIGS. 2(a) to 2(g) schematically show the detection of defects of a TFT array substrate using the method provided by the embodiments of the present disclosure.
Figure 2:
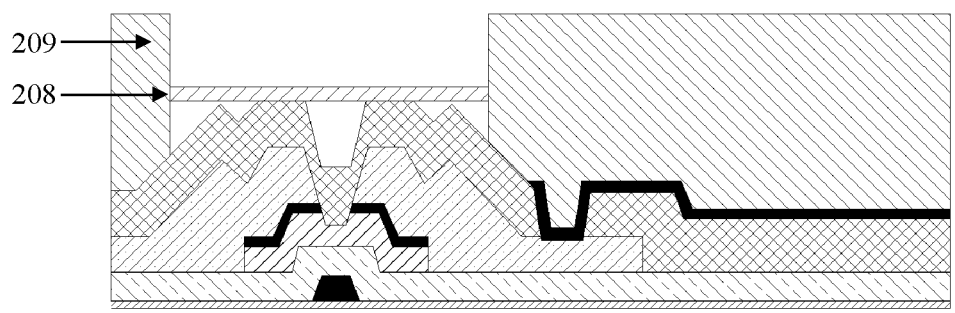
Figure 2:
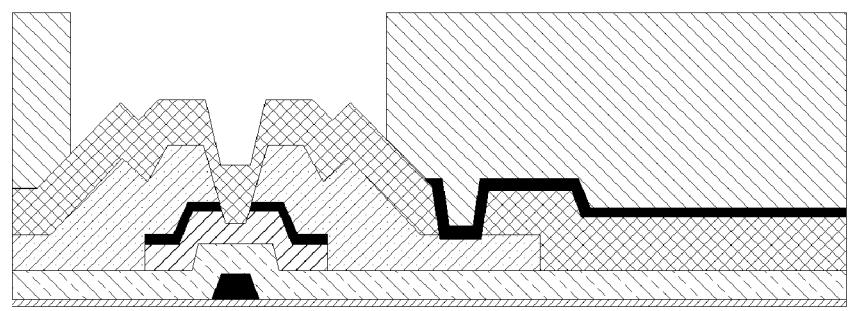
Figure 2:
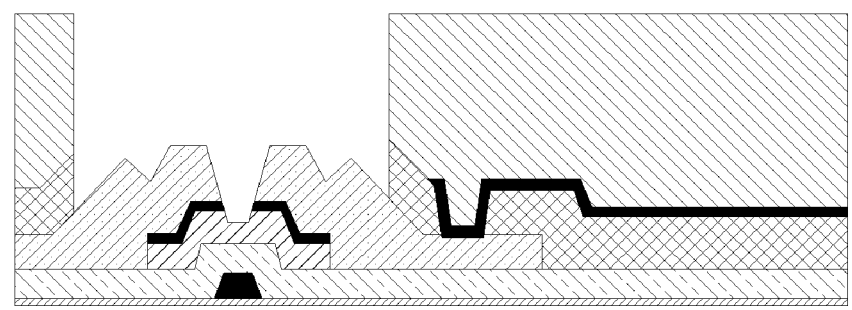
Figure 2:
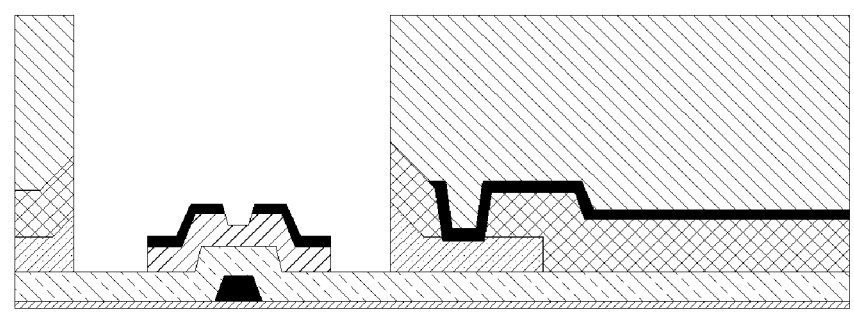
Figure 2:
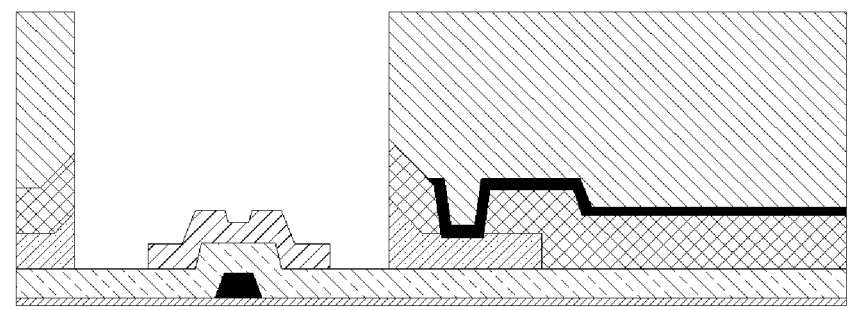
Figure 2:
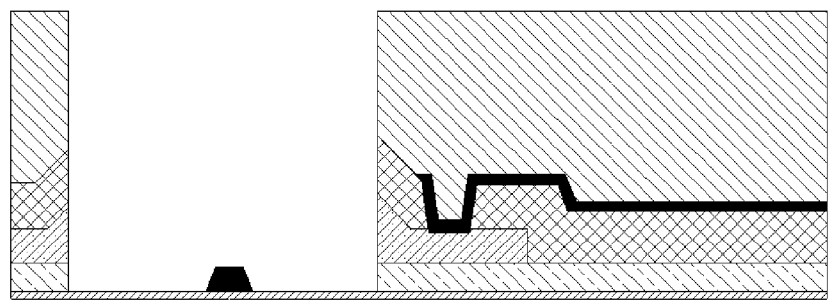

As an example, a TFT array substrate as shown in FIG. 2 is detected for defects. In FIG. 2(a), an area outlined by a dotted line is an abnormal area which is located at a thin film transistor. The thin film transistor comprises a first passivation layer 201, a source-drain metal layer 202, an ohmic contact layer 203, a semi-conductor layer 204, a gate protecting layer 205, and a gate metal layer 206. The detection of the TFT array substrate comprises the following steps.

In step 1, the abnormal area outlined by the dotted line is covered by the separating board at the top thereof. As shown in FIG. 2(b), the separating board 208 is round or elliptical, and has an area 1.2 times larger than the abnormal area. The separating board is made of iron, and is covered at the top of the abnormal area to be detected.

In step 2, as shown in FIG. 2(c), after other areas are coated with Tuffy adhesive which forms the protecting layer 209, the separating board 208 is removed, revealing the first passivation layer 201 which is not covered by Tuffy adhesive. Other areas covered by Tuffy adhesive are protected, and the protecting layer 209 has a thickness of 3 mm.

In step 3, as shown in FIG. 2(d), the first passivation layer 201 is etched using phosphoric acid or HF to reveal the source-drain metal layer 202. The source-drain metal layer 202 is detected using a detecting device. The detection is stopped if a defect is detected, and step 4 is performed if no defect is detected. Specifically, when the passivation layer is formed mainly of SiNx, the remover liquid can be HF. The isolatedly treated array substrate to be detected is immersed into the above remover liquid for 6 min to etch away the SiNx protecting layer. A chemical equation of the reaction occurred in the above process is: $Si_3N_4 + 4HF + 9H_2O = 3H_2SiO_3 + 4NH_4F$.

In step 4, as shown in FIG. 2(e), the source-drain metal layer 202 is etched to reveal the ohmic contact layer 203. The ohmic contact layer 203 is detected using a detecting device. The detection is stopped if a defect is detected, and step 5 is performed if no defect is detected.

In step 5, as shown in FIG. 2(f), the ohmic contact layer 203 is etched to reveal the semi-conductor layer 204. The semi-conductor layer 204 is detected using a detecting device. The detection is stopped if a defect is detected, and step 6 is performed if no defect is detected.

In step 6, as shown in FIG. 2(g), the semi-conductor layer 204 and the gate protecting layer 205 are etched one by one so as to reveal the gate metal layer 206. The gate metal layer 206 is detected using a detecting device.

Besides, in FIG. 2, reference sign 207 indicates a pixel electrode, which is located outside the abnormal area. When the layers in the abnormal area of the thin film transistor are detected, the pixel electrode 207 is not affected due to protection from the protecting layer 209.

It should be noted that the embodiments of the present disclosure provide an example in which an area of the thin film transistor in a certain pixel unit is detected for defects. However, the method provided in the embodiment of the present can also be used in detecting areas of multiple layers outside the thin film transistor in a certain pixel unit, or areas of multiple layers between two pixel units. The present disclosure is not restricted in this regard. When the method provided by the embodiments of the present disclosure is adopted in such detections, the multiple layers to be detected which are independent of the surrounding structures are separated, so as to reduce effects of the surrounding layers on the layers to be detected.

The method for detecting an array substrate provided by the present disclosure is useful in saving detecting devices, and reducing detecting cost and time. For example, in the above detecting process, the analysis of foreign matters in a layer can be carried out by using only one FTIR device. However, in the existing technologies for detecting substrates, the analysis of foreign matters in a layer requires a combination of devices such as a FTIR device, an atomic absorption analyzer, an ultraviolet spectrograph, etc. This is because FITR tests only test the surface of the layer, and an atomic absorption analyzer and an ultraviolet spectrograph are needed to analyze the superimposed layers to obtain analysis results of the layers to be detected. This, of course, will waste sources and time. Further, since molecular structures of each of the layers are different, it is difficult to obtain precise data of the layers even if multiple devices are used. Adopting the method for detecting an array substrate provided by the present disclosure is able to reduce the interactive effects between different layers, thus improving the accuracy of the detection.

To conclude, by analyzing the multiple layers of the TFT array substrate one by one, the method provided by the present disclosure is able to reduce the analysis time, and improve the detecting capability. The method can be used in development of new products, and can reduce the time for developing products, thereby improving the competitiveness of products. Further, the method for analyzing multiple layers provided by the present disclosure is applicable to TFT array substrates having different structures, for example, top-gate array substrates, bottom-gate array substrates, color filter on array (COA) array substrates, etc.

An implementing process of the method provided by the present disclosure will be illustrated below with reference to a COA array substrate which has a more complex structure. FIGS. 3(a) to 3(f) schematically show the detection of detects of the COA TFT array substrate using the method provided by the embodiments of the present disclosure.

Figure 3:
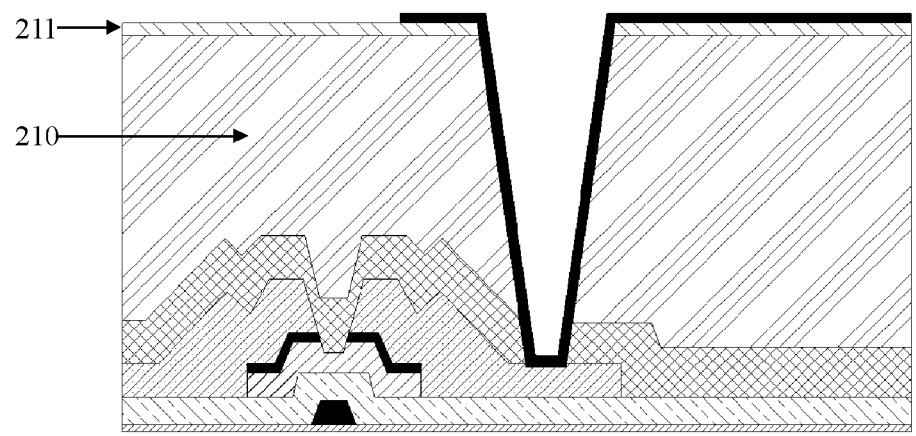
FIGS. 3(a) to 3(f) schematically show the detection of defects of a COA array substrate using the method provided by the embodiments of the present disclosure.
Figure 3:
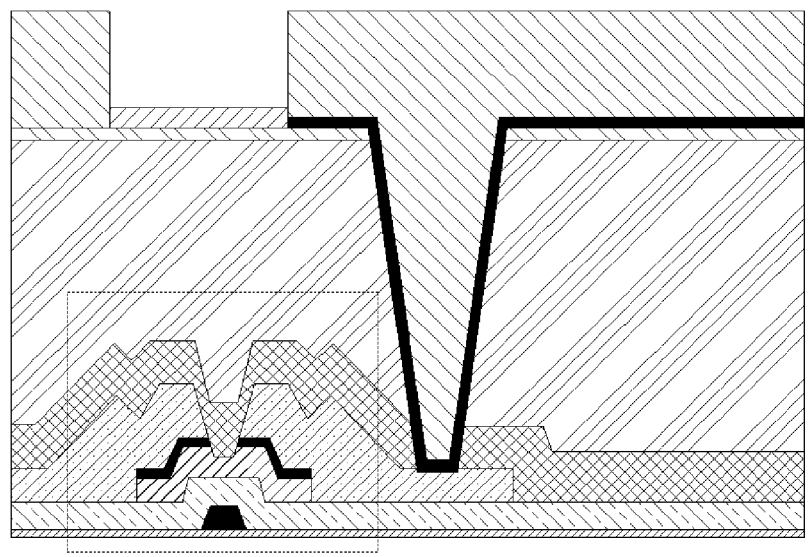
Figure 3:
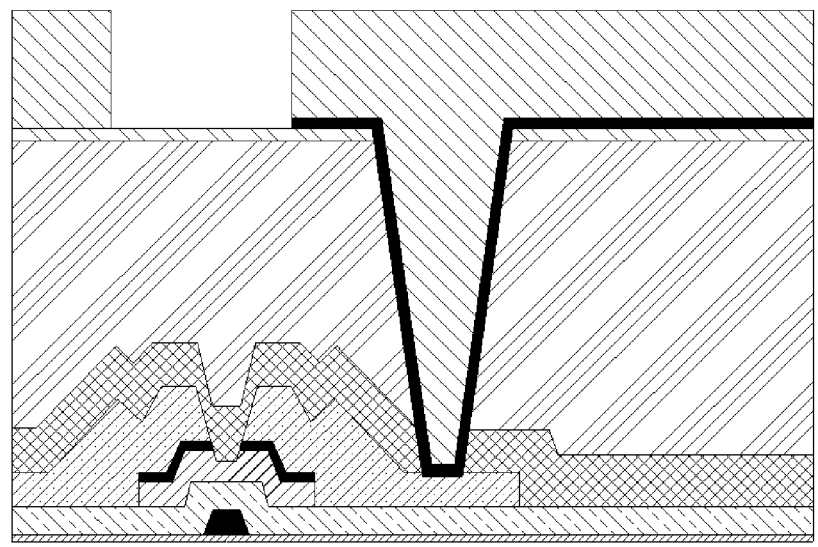
Figure 3:
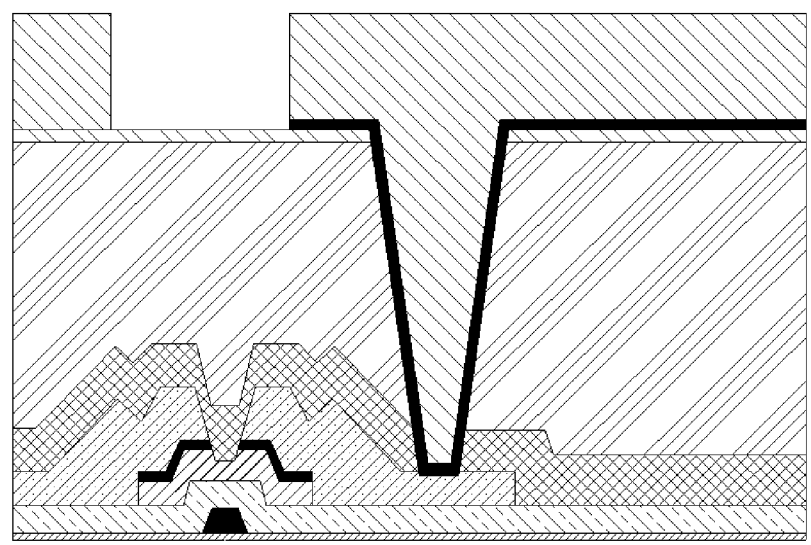
Figure 3:
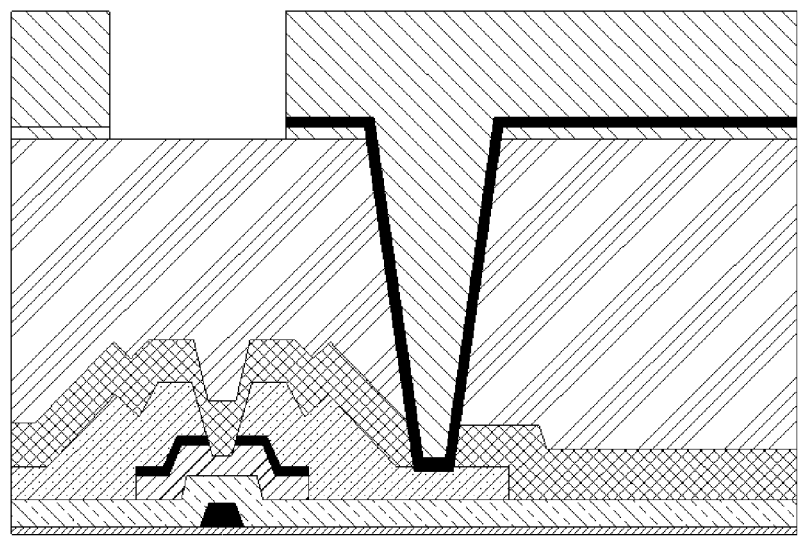
Figure 3:
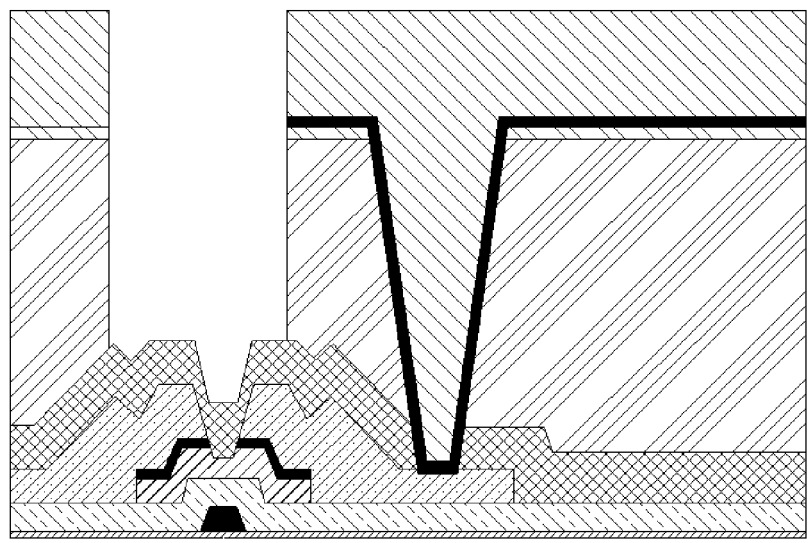

FIG. 3(a) shows the specific structure of a pixel unit of the COA array substrate. It can be seen that, compared with the array substrate in FIG. 2, the COA array substrate further comprises a color resistance layer 210 and a second passivation layer 211 which covers the color resistance layer. The method for detecting defects of the COA array substrate specifically comprises the following steps.

In step 1, the abnormal area is covered by the separating board at the top thereof. As shown in FIG. 3(b), the separating board 208 is round or elliptical, and has an area 1.2 times larger than the abnormal area. The separating board is made of iron, and is covered at the top of the abnormal area to be detected.

In step 2, after other areas are coated with Tuffy adhesive which forms the protecting layer, the separating board is removed. As shown in FIG. 3(b), areas other than the abnormal area are covered by Tuffy adhesive which forms the protecting layer 209 having a thickness of 3 mm. Further, as shown in FIG. 3(c), when the separating board is removed, the areas other than the abnormal area are protected by the protecting layer formed by Tuffy adhesive.

In step 3, the second passivation layer 211 is etched using phosphoric acid or HF to reveal the color resistance layer 210. The color resistance layer is detected using a detecting device. The detection is stopped if a defect is detected, and step 4 is performed if no defect is detected. As shown in FIG. 3(d), when the passivation layer is formed mainly of SiNx, the remover liquid can be HF. The isolatedly treated array substrate to be detected is immersed into the above remover liquid for 6 min to etch away the SiNx protecting layer, and the chemical equation of the reaction is: $Si_3N_4+4HF+9H_2O=3H_2SiO_3+4NH_4F$.

In step 4, the color resistance layer 210 is etched using an alkali to reveal the first passivation layer 201 located at an outmost part of the thin film transistor. If a defect does not exist, the color resistance layer is etched away using an alkali as the remover liquid, which is preferably monoethanolamine. The isolatedly treated array substrate to be detected is immersed into the remover liquid, and heated to a temperature of 75° C. After an immersion for 25 min, the color resistance layer can be removed. As shown in FIG. 3(e), after the above steps, the first passivation layer 201 of the thin film transistor is revealed. The detection will be carried on and completed by performing the method aforementioned, which will not be described herein in detail.

It should be noted that when an array substrate is detected, the detection can usually be stopped when a defective layer is detected. However, considering the interactive effects among the multiple layers, the detection can also be stopped when all the layers are detected. Additionally, if there are several abnormal areas on the array substrate, it is necessary to detect the abnormal areas one by one.

The method provided by the present disclosure is also applicable to test and maintenance of OLED displays, and is able to improve the maintenance efficiency and meanwhile ensure the maintenance quality.

The above embodiments are described only for better understanding, rather than restricting the present disclosure. Anyone skilled in the art can make amendments to the implementing forms or details without departing from the spirit and scope of the present disclosure. The scope of the present disclosure should still be subject to the scope defined in the claims.

The invention claimed is:

1. A method for detecting defects of a TFT array substrate, comprising:
   positioning an abnormal area of the TFT array substrate, separating the abnormal area from other areas of the array substrate, and
   treating the abnormal area as such that multiple layers in the abnormal area can be revealed one by one, and
   detecting the revealed layers to determine a defective layer in the abnormal area.

2. The method according to claim 1, wherein the layers are removed one by one through etching so that the multiple layers in the abnormal area can be revealed one by one.

3. The method according to claim 2, wherein an etching agent and a corresponding etching time are selected as such that only a layer to be etched is etched in each etching, and that a layer to be detected will not be damaged.

4. The method according to claim 1, wherein the detection is stopped when the defective layer is detected, or after each of the layers in the abnormal area is detected.

5. The method according to claim 1, wherein the step of detecting the revealed layers includes detecting the external quality, surface form, thickness, rigidity, adherence, chemical stability, thermostability and/or etching resistance of the layers using a detecting device.

6. The method according to claim 1, wherein the abnormal area is separated from other areas of the array substrate by a specially shaped separating board.

7. The method according to claim 6, wherein the separating board can be formed of a material such as chrome, iron, copper, or polyvinyl acetate.

8. The method according to claim 6, wherein the step of separating the abnormal area from other areas of the array substrate further comprises:
   covering the abnormal area with the specially shaped separating board, and
   removing the separating board when other areas are covered with a coating which forms a protecting layer.

9. The method according to claim 8, wherein the protecting layer contains an adhesive.

10. The method according to claim 8, wherein the protecting layer has a thickness of 0.1 mm-10 mm.

11. The method according to claim 8, wherein an area of the separating board is 10%-30% larger than a range of the abnormal area.

12. The method according to claim 1, if the abnormal area is located at a thin film transistor, comprising steps of:
   step 1, covering the abnormal area at the top thereof using the separating board,
   step 2, coating other areas with an adhesive which forms the protecting layer, and thereafter, removing the separating board,
   step 3, etching a first passivation layer away using phosphoric acid or HF so as to reveal a source-drain metal layer, and detecting the source-drain metal layer using a detecting device; stopping detecting if a defect is detected, and carrying step 4 if no defect is detected,
   step 4, etching the source-drain metal layer to reveal an ohmic contact layer, and detecting the ohmic contact layer using a detecting device; stopping detecting if a defect is detected, and carrying step 5 if no defect is detected,
   step 5, etching the ohmic contact layer to reveal a semi-conductor layer, and detecting the semi-conductor layer using a detecting device; stopping detecting if a defect is detected, and carrying step 6 if no defect is detected, and
   step 6, etching the semi-conductor layer and then a gate protecting layer so as to reveal a gate metal layer, and detecting the gate metal layer using a detecting device.

13. The method according to claim 12, if the thin film transistor in the abnormal area is further provided with a color resistance layer and a second passivation layer at the top thereof, further comprising, prior to step 3, steps of:

etching the second passivation layer using phosphoric acid or HF so as to reveal the color resistance layer, detecting the color resistance layer using a detecting device, and etching the color resistance layer using alkali to reveal the first passivation layer located at an outmost part of the thin film transistor.

14. The method according to claim 12, wherein the separating board is a round or elliptical iron sheet, and the area of the separating board is determined by the range of the abnormal area.

* * * * *